(12) United States Patent
Shin

(10) Patent No.: US 7,517,752 B2
(45) Date of Patent: Apr. 14, 2009

(54) METHOD OF FABRICATING SEMICONDUCTOR DEVICE HAVING STORAGE CAPACITOR AND HIGHER VOLTAGE RESISTANCE CAPACITOR AND SEMICONDUCTOR DEVICE FABRICATED USING THE SAME

(75) Inventor: Hwa-Sook Shin, Suwon-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 123 days.

(21) Appl. No.: 11/654,010

(22) Filed: Jan. 17, 2007

(65) Prior Publication Data

US 2007/0166943 A1 Jul. 19, 2007

(30) Foreign Application Priority Data

Jan. 18, 2006 (KR) .................... 10-2006-0005413

(51) Int. Cl.
*H01L 21/8242* (2006.01)
(52) U.S. Cl. ...................... 438/250; 257/310
(58) Field of Classification Search ......... 438/239–241, 438/250, 253, 254; 257/303, 306, 310, E27.093
See application file for complete search history.

(56) References Cited

U.S. PATENT DOCUMENTS

| 6,126,847 | A | 10/2000 | Thakur et al. |
| 6,207,495 | B1 | 3/2001 | Choi |
| 6,566,191 | B2 | 5/2003 | Hsu et al. |
| 7,011,999 | B2 * | 3/2006 | Minami et al. .............. 438/210 |
| 2003/0129799 | A1 | 7/2003 | Nam et al. |

FOREIGN PATENT DOCUMENTS

| KR | 10-2002-0045270 | 6/2002 |
| KR | 10-2005-0066826 | 6/2005 |
| KR | 1020050093163 A | 9/2005 |

OTHER PUBLICATIONS

Korean Notice of Office Action dated Mar. 30, 2007.
German Office Action dated Sep. 2, 2007 in corresponding German Application No. 10 2007 003 450.6-33.

* cited by examiner

*Primary Examiner*—David Vu
(74) *Attorney, Agent, or Firm*—Harness, Dickey & Pierce P.L.C.

(57) ABSTRACT

Provided are a method of fabricating a semiconductor device having different kinds of capacitors, and a semiconductor device formed using the same. In a fabrication process, after preparing a substrate including a storage capacitor region and a higher voltage resistance capacitor region, a lower electrode layer may be formed on the storage capacitor region and the higher voltage resistance capacitor region. A first dielectric film may be formed on the lower electrode layer, and the first dielectric film of the storage capacitor region may be selectively removed to expose the lower electrode layer of the storage capacitor region. After forming a second dielectric film on the first dielectric film and the exposed lower electrode layer of the storage capacitor region, an upper electrode layer may be formed on the second dielectric film.

17 Claims, 3 Drawing Sheets

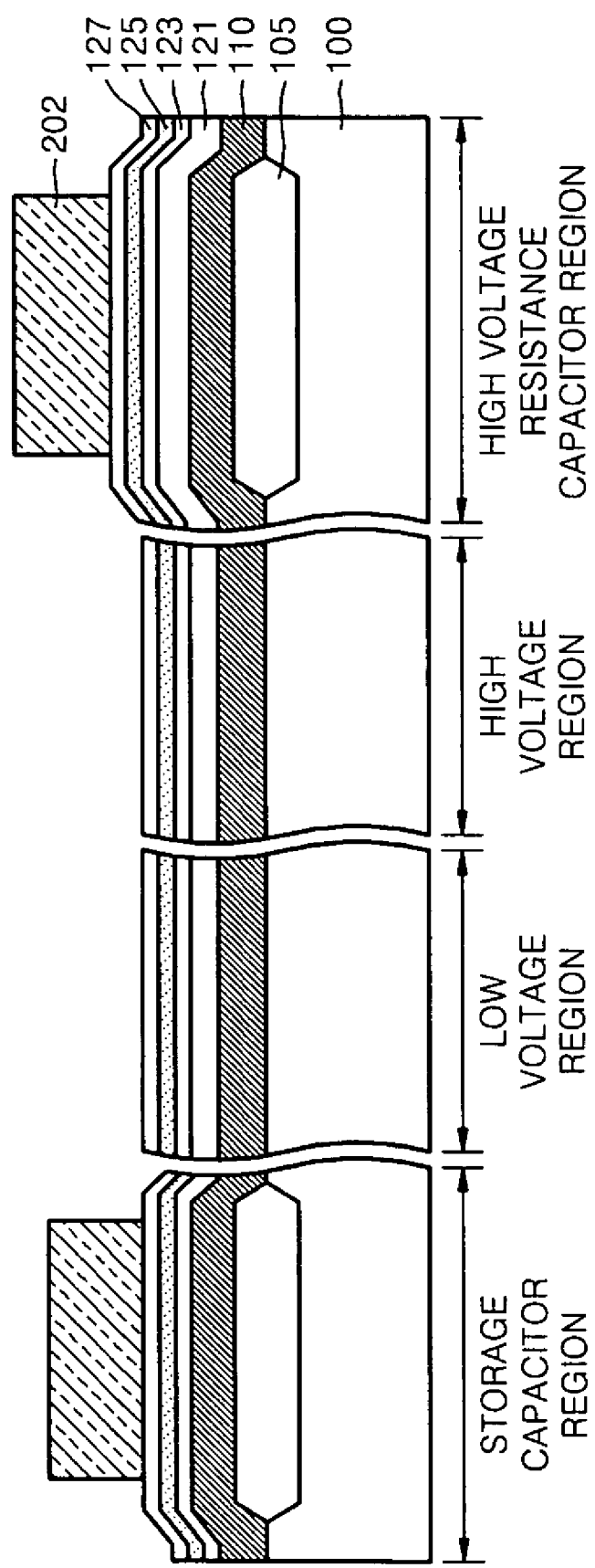

METHOD OF FABRICATING SEMICONDUCTOR DEVICE HAVING STORAGE CAPACITOR AND HIGHER VOLTAGE RESISTANCE CAPACITOR AND SEMICONDUCTOR DEVICE FABRICATED USING THE SAME

PRIORITY STATEMENT

This application claims priority under 35 USC § 119 to Korean Patent Application No. 10-2006-0005413, filed on Jan. 18, 2006, in the Korean Intellectual Property Office (KIPO), the entire contents of which are incorporated herein by reference.

BACKGROUND

1. Field

Example embodiments relate to a method of fabricating a semiconductor device and a semiconductor device fabricated using the same. Other example embodiments relate to a method of fabricating a semiconductor device having different kinds of capacitors and a semiconductor device fabricated using the same.

2. Description of the Related Art

Capacitors applied to semiconductor devices may be used for storing charges, filtering, blocking DC signals and/or decoupling. These variously used capacitors may require different conditions according to their functions. Accordingly, when a single semiconductor device is equipped with variously used capacitors, processing factors (e.g., electrode types and/or kinds and thicknesses of dielectric films) may be diversified to form the capacitors. The capacitors formed on a single substrate may be formed using the same manufacturing process in view of manufacturing cost. This may restrict the diversification of the processing factors. Various kinds of capacitors may have the same structure on the same layer.

SUMMARY

Example embodiments provide a method of fabricating a semiconductor device having capacitors that satisfy different electrical conditions on the same layer without increasing the number of processing steps, and a semiconductor device fabricated using the same.

According to example embodiments, there is provided a method of fabricating a semiconductor device. After preparing a substrate including a storage capacitor region and a higher voltage resistance capacitor region, a lower electrode layer may be formed on the storage capacitor region and the higher voltage resistance capacitor region. A first dielectric film may be formed on the lower electrode layer, and the first dielectric film of the storage capacitor region may be selectively removed to expose the lower electrode layer of the storage capacitor region. A second dielectric film may be formed on the first dielectric film and the exposed lower electrode layer of the storage capacitor region and an upper electrode layer may be formed on the second dielectric film.

The first dielectric film and the second dielectric film may be composed of the same material. The first dielectric film and the second dielectric film may be composed of $SiO_2$. Alternatively, the first dielectric film and the second dielectric film may be composed of different materials. The first dielectric film may be composed of a dielectric material selected from the group consisting of $Ta_2O_5$, $Al_2O_3$, $HfO_2$ and a combination of these materials. The second dielectric film may be composed of silicon oxide.

A third dielectric film may be formed on the second dielectric film. The second dielectric film may be composed of silicon oxide, and the third dielectric film may be composed of SiNx. A fourth dielectric film may be formed on the third dielectric film, and the fourth dielectric film may be composed of $SiO_2$. The first dielectric film may be composed of a dielectric material selected from a group consisting of $SiO_2$, $Ta_2O_5$, $Al_2O_3$, $HfO_2$ and/or a combination of these materials.

A higher voltage resistance capacitor of the higher voltage resistance capacitor region may be a decoupling capacitor. The lower electrode layer and the upper electrode layer may be composed of polysilicon. The first dielectric film of the storage capacitor region may be removed by wet etching. Before forming the upper electrode layer, the dielectric films and the lower electrode layer may be patterned to form a first structure having sequentially stacked a storage lower electrode and the second dielectric film on the storage capacitor region and a second structure having sequentially stacked a higher voltage resistance lower electrode and the first and the second dielectric films on the higher voltage resistance capacitor region.

The substrate may further include a lower voltage region and a higher voltage region. The upper electrode layer may be formed on the lower voltage region and the higher voltage region. Also, the upper electrode layer may be patterned to form upper electrodes on the dielectric films of storage capacitor region and the higher voltage resistance capacitor region. Simultaneously, a lower voltage gate electrode and a higher voltage gate electrode may be respectively formed on the lower voltage region and the higher voltage region. The lower electrode layer and the dielectric films may be formed on the lower voltage region and the higher voltage region. Before the forming of the upper electrode layer, the dielectric films and the lower electrode layer may be patterned to form a first structure having sequentially stacked a storage lower electrode and the second dielectric film on the storage capacitor region and a second structure having sequentially stacked a higher voltage resistance lower electrode and the first and the second dielectric films on the higher voltage resistance capacitor region. Simultaneously, the substrate of the lower voltage region and the higher voltage region may be exposed. A higher voltage gate insulating layer may be formed on the exposed substrate of the higher voltage region, and the lower voltage gate insulating layer may be formed on the exposed substrate of the lower voltage region. Thereafter, the upper electrode layer may be formed on the gate insulating layers.

According to other example embodiments, there is provided a semiconductor device. The semiconductor device may include a substrate having a storage capacitor region and a higher voltage resistance capacitor region. Lower electrodes may be respectively disposed on the storage capacitor region and the higher voltage resistance capacitor region, and a first dielectric film may be selectively disposed on the lower electrode of the higher voltage resistance capacitor region. A second dielectric film may be disposed on the lower electrode of the storage capacitor region and the first dielectric film, and upper electrodes may be disposed on the second dielectric film to respectively correspond to the lower electrodes.

The substrate may further have a lower voltage region and a higher voltage region. A lower voltage gate electrode and a higher voltage gate electrode composed of the same material as the upper electrode may be respectively disposed on the lower voltage region and the higher voltage region.

BRIEF DESCRIPTION OF THE DRAWINGS

Example embodiments will be more clearly understood from the following detailed description taken in conjunction with the accompanying drawings. FIGS. 1A-1C represent non-limiting, example embodiments as described herein.

FIGS. 1A through 1C are diagrams illustrating a method of fabricating a semiconductor device according to example embodiments.

DETAILED DESCRIPTION OF EXAMPLE EMBODIMENTS

Figure 1A:
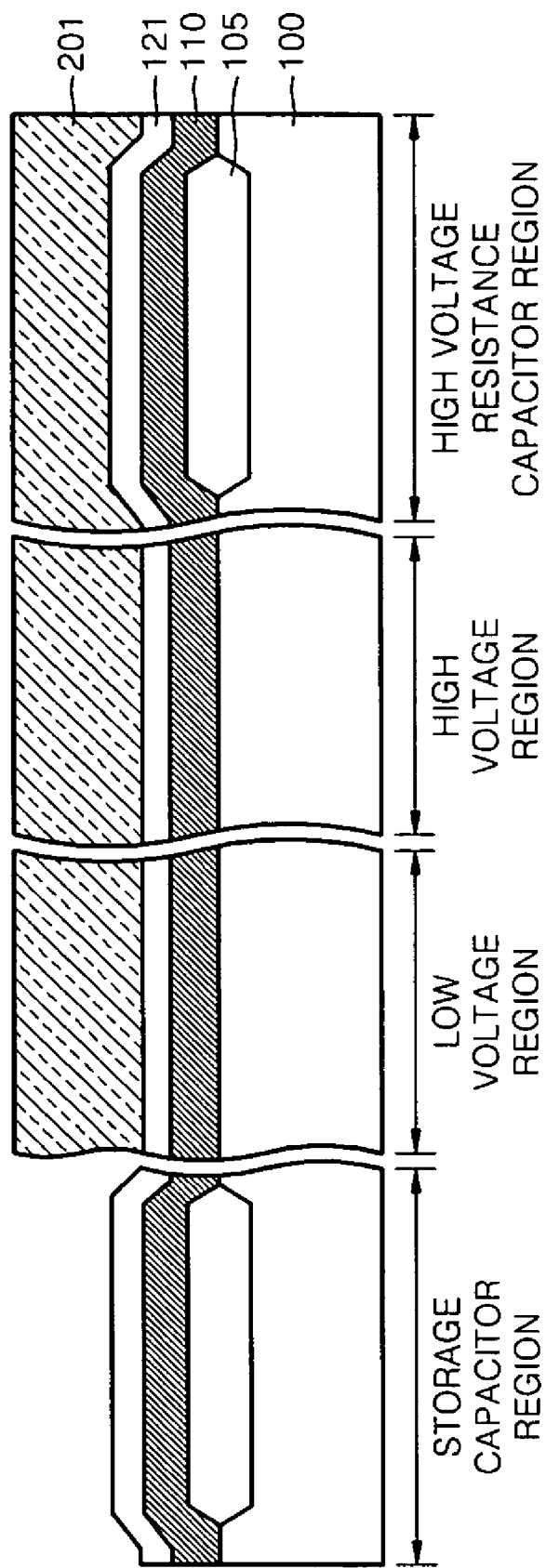

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those skilled in the art. Like reference numerals herein denote like elements. In the drawings, the size and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1C:
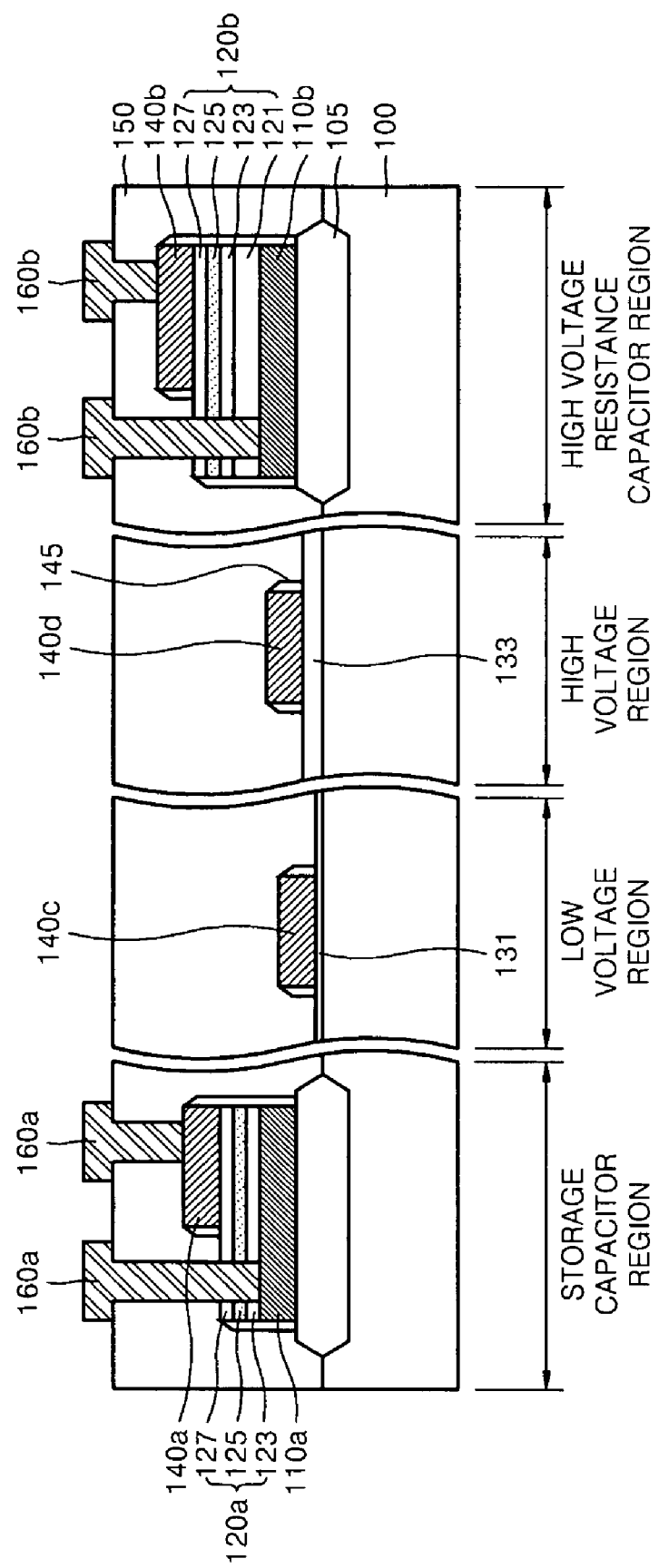

FIGS. 1A-1C are diagrams illustrating a method of fabricating a semiconductor device according to example embodiments. Referring to FIG. 1A, a semiconductor substrate 100 may have a storage capacitor region, a lower voltage region, a higher voltage region and/or a higher voltage resistance capacitor region. Device isolating layers 105 may be formed within the substrate 100 to define active regions. According to example embodiments, the device isolating layers 105 may be formed using Local Oxidation of Silicon (LOCOS), but may not be restricted thereto and may also be formed using trench isolation.

A lower electrode layer 110 may be formed on the substrate 100 having the device isolating layers 105. The lower electrode layer 110 may be a conductive layer, which may be composed of a metal and/or a semiconductor, for example, polysilicon. If the lower electrode layer 110 is composed of polysilicon, an impurity may be doped into the lower electrode layer 100 to adjust conductivity. Phosphor (P) or Arsenic (As) may be ion-implanted. A first dielectric film 121 may be formed on the lower electrode layer 110. A first photoresist pattern 201 exposing the first dielectric film 121 of the storage capacitor region may be formed on the first dielectric film 121 of other regions. Referring to FIG. 1B, the exposed first dielectric film 121 may be etched using the first photoresist pattern 201 as a mask. The lower electrode layer 110 may be exposed in the storage capacitor region. The first dielectric film 121 may be wet etched. Damage to the lower electrode layer 110 may be minimized or reduced during the etching of the first dielectric film 121. The first photoresist pattern 201 may be removed.

A second dielectric film 123 may be formed on the exposed lower electrode layer 110 and the first dielectric film 121. The first dielectric film 121 and the second dielectric film 123 may be respectively composed of $SiO_2$, $SiN_x$, $Ta_2O_5$, $Al_2O_3$, $HfO_2$ and/or a composite of these materials. The first dielectric film 121 and the second dielectric film 123 may be composed of the same material. The first dielectric film 121 and/or the second dielectric film 123 may be composed of $SiO_2$. The first dielectric film 121 and/or the second dielectric film 123 may be composed of different materials. The first dielectric film 121 may be composed of a material with a relatively high dielectric constant, e.g., a dielectric film selected from a group consisting of $Ta_2O_5$, $Al_2O_3$, $HfO_2$ and/or a composite layer of these materials. Also, the second dielectric film 123 may be composed of silicon oxide. The first dielectric film 121 and the second dielectric film 123 may be formed using Chemical Vapor Deposition (CVD).

A third dielectric film 125 may be formed on the second dielectric film 123. The third dielectric film 125 may be composed of $SiO_2$, $SiN_x$, $Ta_2O_5$, $Al_2O_3$, $HfO_2$ and/or a composite layer of these materials. The third dielectric film 125 may be $SiN_x$. A fourth dielectric film 127 may be formed on the third dielectric film 125. The fourth dielectric film 127 may be composed of SiO$_2$, SiNx, Ta$_2$O$_5$, Al$_2$O$_3$, HfO$_2$ and/or a composite layer of these materials. The fourth dielectric film 127 may be silicon oxide. A second photoresist pattern 202 may be formed on the fourth dielectric film 127 to partially shield the storage capacitor region and the higher voltage resistance capacitor region.

Referring to FIG. 1C, the fourth dielectric film 127, the third dielectric film 125, the second dielectric film 123, the first dielectric film 121, and the lower electrode layer 110 may be sequentially etched using the second photoresist pattern 202 as a mask. A first structure having sequentially stacked a storage capacitor lower electrode 110a and a storage dielectric film 120a on the storage capacitor region, and a second structure having sequentially stacked a higher voltage resistance lower electrode 110b and a higher voltage resistance dielectric film 120b on the higher voltage resistance capacitor region may be formed. The storage dielectric film 120a may include the second dielectric film 123, the third dielectric film 125 and the fourth dielectric film 127. The higher voltage resistance dielectric film 120b may include the first dielectric film 121, the second dielectric film 123, the third dielectric film 125 and the fourth dielectric film 127. The substrate 100 may be exposed in the lower voltage region and the higher voltage region.

A higher voltage gate insulating layer 133 may be formed on the substrate 100 of the higher voltage region. Also, a lower voltage gate insulating layer 131 may be formed on the substrate 100 of the lower voltage region. The higher voltage gate insulating layer 133 and the lower voltage gate insulating layer 131 may be thermal oxidation layers formed by thermally oxidizing the substrate 100. An upper electrode layer may be formed on the substrate 100 on which the lower voltage and higher voltage gate insulating layers 131 and 133 may be formed, respectively. The upper electrode layer may be a conductive layer, which may be composed of a metal and/or a semiconductor, for example, polysilicon. When the upper electrode layer is composed of polysilicon, an impurity may be doped into the upper electrode layer to adjust conductivity. The impurity may be phosphor (P) doped using a POCl$_3$ process.

By patterning the upper electrode layer, a storage upper electrode 140a may be formed on the storage dielectric film 120a of the storage capacitor region, a higher voltage resistance upper electrode 140b may be formed on the higher voltage resistance dielectric film 120b of the higher voltage resistance capacitor region, and a lower voltage gate electrode 140c and a higher voltage gate electrode 140d may be respectively formed on the lower voltage and higher voltage gate insulating layers 131 and 133 of the lower voltage region and the higher voltage region. The storage upper electrode 140a and the higher voltage resistance upper electrode 140b may be formed to partially expose the storage dielectric film 120a and the higher voltage resistance dielectric film 120b, respectively.

The storage lower electrode 110a, the storage dielectric film 120a and the storage upper electrode 140a may constitute a storage capacitor. The higher voltage resistance lower electrode 110b, the higher voltage resistance dielectric film 120b, and the higher voltage resistance upper electrode 140b may constitute a higher voltage resistance capacitor. Because of the inclusion of the first dielectric film 121 in the higher voltage resistance dielectric film 120b as compared with the storage dielectric film 120a, the higher voltage resistance dielectric film 120b may be thicker than the storage dielectric film 120a. Accordingly, the higher voltage resistance capacitor may have a higher breakdown voltage. Even when a higher electrical field is continuously applied between the higher voltage resistance upper electrode 140b and the higher voltage resistance lower electrode 110b, a desired electrical characteristic may be maintained so that improved long-term reliability may be secured. The storage capacitor may have a higher capacitance than that of the higher voltage resistance capacitor. If the first dielectric film 121 is composed of a material having a higher dielectric constant, the capacitance of the higher voltage resistance capacitor may not be decreased in spite of increasing the thickness of the higher voltage resistance dielectric film 120b.

As described above, the higher voltage resistance capacitor and the storage capacitor that satisfy different electrical requirements may be formed within a single layer without increasing the number of fabrication steps. The upper electrodes 140a, 140b of the above-described capacitors may be composed of polysilicon, so that the gate electrodes 140c, 140d may be simultaneously formed when forming the upper electrodes 140a, 140b, thereby decreasing the number of fabrication steps. A spacer insulating layer may be stacked on the storage upper electrode 140a, the higher voltage resistance upper electrode 140b, the lower voltage gate electrode 140c, and the higher voltage gate electrode 140d. The spacer insulating layer may be anisotropically etched to form spacers 145 along sidewalls of the storage upper electrode 140a and the higher voltage resistance upper electrode 140b, the storage dielectric film 120a and the higher voltage resistance 120b, the storage lower electrode 110a and the higher voltage resistance lower electrode 110b, and the lower voltage gate electrode 140c and the higher voltage gate electrode 140d. An interlayer insulating layer 150 may be formed on the substrate 100 having the spacers 145 thereon to cover the storage upper electrode 140a, the higher voltage resistance upper electrode 140b, the lower voltage gate electrode 140c, and the higher voltage gate electrode 140d.

Contact holes may be formed in the interlayer insulating layer 150. A conductive layer may be filled in the contact holes. The conductive layer may be patterned to form storage lines 160a and power supply lines 160b. One of the storage lines 160a may penetrate through the interlayer insulating layer 150 and the storage dielectric film 120a to be connected to the storage lower electrode 110a. Another storage line 160a may penetrate through the interlayer insulating layer 150 to be connected to the storage upper electrode 140a. One of the power supply lines 160b may penetrate through the interlayer insulating layer 150 and the higher voltage resistance dielectric film 120b to be connected to the higher voltage resistance lower electrode 110b. Another power supply line 160b may penetrate through the interlayer insulating layer 150 to be connected to the higher voltage resistance upper electrode 140b.

The storage capacitor may be used for storing charges, and the higher voltage resistance capacitor may be a decoupling capacitor that buffers an abrupt increase and/or decrease of the power supply voltage. When the semiconductor device demands a specific power supply voltage, the decoupling capacitor may be disposed between the power supply voltage and the ground power supply voltage. According to example embodiments as described above, capacitors that satisfy mutually different electrical requirements may be formed within the same layer without greatly increasing the number of processing steps.

While example embodiments have been particularly shown and described with reference to example embodiments thereof, it will be understood by those of ordinary skill in the art that various changes in form and details may be made therein without departing from the spirit and scope of the following claims.

What is claimed is:

1. A method of fabricating a semiconductor device, comprising:
 preparing a substrate including a storage capacitor region and a higher voltage resistance capacitor region;
 forming a lower electrode layer on the storage capacitor region and the higher voltage resistance capacitor region;
 forming a first dielectric film on the lower electrode layer;
 selectively removing the first dielectric film of the storage capacitor region to expose the lower electrode layer of the storage capacitor region;
 forming a second dielectric film on the first dielectric film and the exposed lower electrode layer of the storage capacitor region; and
 forming an upper electrode layer on the second dielectric film.

2. The method of claim 1, wherein forming the first dielectric film and the second dielectric film includes forming the first dielectric film and the second dielectric film of the same material.

3. The method of claim 2, wherein forming the first dielectric film and the second dielectric film includes forming the first dielectric film and the second dielectric film of silicon oxide ($SiO_2$).

4. The method of claim 1, wherein forming the first dielectric film and the second dielectric film includes forming the first dielectric film and the second dielectric film of different materials.

5. The method of claim 4, wherein forming the first dielectric film includes forming the first dielectric film of a dielectric material selected from the group consisting of $Ta_2O_5$, $Al_2O_3$, $HfO_2$ and a combination of these materials.

6. The method of claim 4, wherein forming the second dielectric film includes forming the second dielectric film of $SiO_2$.

7. The method of claim 1, before forming the upper electrode layer, further comprising:
 forming a third dielectric film on the second dielectric film.

8. The method of claim 7, wherein forming the second dielectric film includes forming the second dielectric film of $SiO_2$, and forming the third dielectric film includes forming the third dielectric film of silicon nitride ($SiNx$).

9. The method of claim 8, before forming the upper electrode layer, further comprising:
 forming a fourth dielectric film on the third dielectric film, wherein forming the fourth dielectric film includes forming the fourth dielectric film of $SiO_2$.

10. The method of claim 8, wherein forming the first dielectric film includes forming the first dielectric film of a dielectric material selected from the group consisting of $SiO_2$, $Ta_2O_5$, $Al_2O_3$, $HfO_2$ and a combination of these materials.

11. The method of claim 1, wherein a higher voltage resistance capacitor of the higher voltage resistance capacitor region is a decoupling capacitor.

12. The method of claim 1, wherein forming the lower electrode layer and the upper electrode layer includes forming the lower and upper electrode layers of polysilicon.

13. The method of claim 1, wherein removing the first dielectric film of the storage capacitor region includes removal by wet etching.

14. The method of claim 1, before forming the upper electrode layer, further comprising:
 patterning the dielectric films and the lower electrode layer to form a first structure having sequentially stacked a storage lower electrode and the second dielectric film on the storage capacitor region and a second structure having sequentially stacked a higher voltage resistance lower electrode and the first and the second dielectric films on the higher voltage resistance capacitor region.

15. The method of claim 1, wherein preparing the substrate further comprises:
 providing a lower voltage region and a higher voltage region;
 forming the upper electrode layer on the lower voltage region and the higher voltage region; and
 patterning the upper electrode layer to form upper electrodes on the dielectric films of the storage capacitor region and the higher voltage resistance capacitor region, and simultaneously, forming a lower voltage gate electrode and a higher voltage gate electrode on the lower voltage region and the higher voltage region, respectively.

16. The method of claim 15, wherein forming the lower electrode layer and the dielectric films includes forming the lower electrode layer and the dielectric films on the lower voltage region and the higher voltage region.

17. The method of claim 15, before the forming of the upper electrode layer, further comprising:
 patterning the dielectric films and the lower electrode layer to form a first structure having a storage lower electrode and the second dielectric film sequentially stacked on the storage capacitor region and a second structure having a higher voltage resistance lower electrode and the first and the second dielectric films sequentially stacked on the higher voltage resistance capacitor region, and simultaneously, exposing the substrate of the lower voltage region and the higher voltage region;
 forming a higher voltage gate insulating layer on the exposed substrate of the higher voltage region; and
 forming a lower voltage gate insulating layer on the exposed substrate of the lower voltage region, and
 wherein the upper electrode layer formed on the lower voltage region and the higher voltage region is formed on the higher voltage gate insulating layer and the lower voltage gate insulating layer.

* * * * *